United States Patent
Wu

(10) Patent No.: US 7,952,127 B2
(45) Date of Patent: May 31, 2011

(54) STORAGE NODE OF STACK CAPACITOR AND FABRICATION METHOD THEREOF

(75) Inventor: Hsiao-Ting Wu, Yilan County (TW)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 303 days.

(21) Appl. No.: 12/346,837

(22) Filed: Dec. 31, 2008

(65) Prior Publication Data

US 2010/0102374 A1    Apr. 29, 2010

(30) Foreign Application Priority Data

Oct. 29, 2008  (TW) ............................... 97141573 A

(51) Int. Cl.
  *H01L 27/108*  (2006.01)
  *H01L 29/76*   (2006.01)
  *H01L 29/94*   (2006.01)

(52) U.S. Cl. .. 257/296; 257/306; 257/308; 257/E27.025
(58) Field of Classification Search ................. 257/296, 257/306, 308, E27.025
  See application file for complete search history.

(56) References Cited

U.S. PATENT DOCUMENTS

| | | | | |
|---|---|---|---|---|
| 7,294,546 B2 * | 11/2007 | Kim et al. | ..................... | 438/253 |
| 7,364,967 B2 * | 4/2008  | Kim et al. | ..................... | 438/254 |
| 7,439,125 B2 * | 10/2008 | Tegen et al. | ................... | 438/238 |
| 2004/0084709 A1 * | 5/2004 | Kim et al. | ..................... | 257/306 |
| 2008/0081431 A1 * | 4/2008 | Roh et al. | ..................... | 438/397 |
| 2008/0124911 A1 * | 5/2008 | Kim et al. | ..................... | 438/612 |
| 2008/0128912 A1 * | 6/2008 | Streck et al. | .................. | 257/762 |
| 2009/0121317 A1 * | 5/2009 | Lee et al. | ..................... | 257/532 |
| 2009/0140431 A1 * | 6/2009 | Feustel et al. | ................. | 257/758 |
| 2009/0162986 A1 * | 6/2009 | Ahn et al. | ..................... | 438/386 |
| 2009/0311842 A1 * | 12/2009 | Kuo | .............................. | 438/396 |
| 2009/0321931 A1 * | 12/2009 | Lee et al. | ..................... | 257/741 |
| 2010/0117196 A1 * | 5/2010 | Manning | ...................... | 257/532 |
| 2010/0127316 A1 * | 5/2010 | Tu et al. | ....................... | 257/296 |
| 2010/0151653 A1 * | 6/2010 | Bhat et al. | .................... | 438/387 |

FOREIGN PATENT DOCUMENTS

CN           101299421 A    11/2005

* cited by examiner

*Primary Examiner* — Ngan Ngo

(74) *Attorney, Agent, or Firm* — Winston Hsu; Scott Margo

(57) ABSTRACT

A storage node structure includes a substrate having thereon a conductive block region; an etching stop layer covering the conductive block region; a conductive layer penetrating the etching stop layer and electrically connecting the conductive block region; an annular shaped conductive spacer on sidewall of the conductive layer, wherein the annular shaped conductive spacer is disposed on the etching stop layer and wherein the annular shaped conductive spacer and the conductive layer constitute a storage node pedestal; and an upper node portion stacked on the storage node pedestal.

9 Claims, 14 Drawing Sheets

STORAGE NODE OF STACK CAPACITOR AND FABRICATION METHOD THEREOF

BACKGROUND OF THE INVENTION

1. Field of the Invention

The present invention relates generally to semiconductor memory devices. More particularly, the present invention relates to a storage node structure of a stack capacitor and fabrication method thereof.

2. Description of the Prior Art

It has been the trend to scale down the sizes of memory cells to increase the integration level and thus memory capacity of a DRAM chip in the semiconductor industry. As the sizes of DRAM devices are decreased, the capacity of a capacitor in the DRAM devices is correspondingly decreased. One approach to increasing capacity of the capacitor involves increasing the surface area of the storage node. As known in the art, the surface area of a storage node in a capacitor-over-bit-line (COB) structure is mostly increased by increasing the height as the design rule limits the horizontal dimension of the storage node. However, increasing the height of the storage node causes structure instability of the storage node, which is the cause of device failure due to two-bit or multi-bit failure during DRAM operation.

FIGS. 1-5 are schematic, cross-sectional diagrams showing a conventional method for fabricating a storage node of a crown-type stacked cell capacitor. As shown in FIG. 1, a substrate 10 such as a silicon substrate having thereon conductive blocks 12a and 12b is provided. A dielectric layer 14 such as silicon nitride and a dielectric layer 16 such as undoped silicate glass (USG) are deposited over the substrate 10.

As shown in FIG. 2, a conventional lithographic process and a dry etching process are carried out to define high aspect ratio openings 18a and 18b in the dielectric layers 14 and 16. Subsequently, a cleaning process may be performed to remove the etching byproducts or particles from the surfaces of the substrate 10 and from the interior surfaces of the openings 18a and 18b.

As shown in FIG. 3, a chemical vapor deposition (CVD) process is carried out to form a conformal silicon layer 22 on the surface of the dielectric layer 16 and on the interior surfaces of the openings 18a and 18b. The silicon layer 22 may be doped polysilicon.

As shown in FIG. 4, a planarization process such as chemical mechanical polishing (CMP) is performed to selectively remove the silicon layer 22 from the surface of the dielectric layer 16, while leaving the silicon layer 22 on the interior surfaces of the openings 18a and 18b intact.

Subsequently, as shown in FIG. 5, a wet etching process involving the use of HF/NH$_4$F chemistry or Buffer Oxide Etcher (BOE) is performed to remove the dielectric layer 16, thereby forming storage nodes 30a and 30b. Typically, the height H of each of the storage nodes 30a and 30b is approximately equal to the depth of the openings 18a and 18b, which is normally 1.6-1.7 micrometers.

One drawback of the above-mentioned prior art method is that when forming the high aspect ratio openings 18a and 18b it is difficult to obtain a straight sidewall profile. The tapered sidewall profile of the high aspect ratio openings 18a and 18b leads to small bottom critical dimension A. The small bottom critical dimension A results in so-called storage node bridge phenomenon during subsequent cleaning or drying processes.

SUMMARY OF THE INVENTION

Therefore, it is one objective to provide an improved storage node structure of a stack capacitor in order to avoid the aforementioned storage node bridge phenomenon.

It is another objective to provide a method for fabricating a storage node structure of a stack capacitor to solve the above-mentioned prior art problems.

To these ends, according to one aspect of the present invention, there is provided a storage node structure including a substrate having thereon at least one conductive block; an etching stop layer covering the conductive block; a conductive later penetrating through the etching stop layer and electrically connecting with the conductive block; an annular shaped conductive spacer on sidewall of the conductive layer, wherein the conductive layer and the annular shaped conductive spacer constitute a storage node pedestal; and an upper node portion stacked on the storage node pedestal.

In one aspect, a method for fabricating a storage node structure of a stack capacitor includes providing a substrate having thereon a conductive block, an etching stop layer covering the conductive layer and a first dielectric layer covering the etching stop layer; etching a first opening into the first dielectric layer and the etching stop layer, thereby exposing a top surface of the conductive block; forming a first conductive layer in the first opening; removing the first dielectric layer; forming an annular shaped conductive spacer on sidewall of the first conductive layer, wherein the annular shaped conductive spacer and the first conductive layer constitute a storage node pedestal; and forming an upper node portion on the storage node pedestal.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
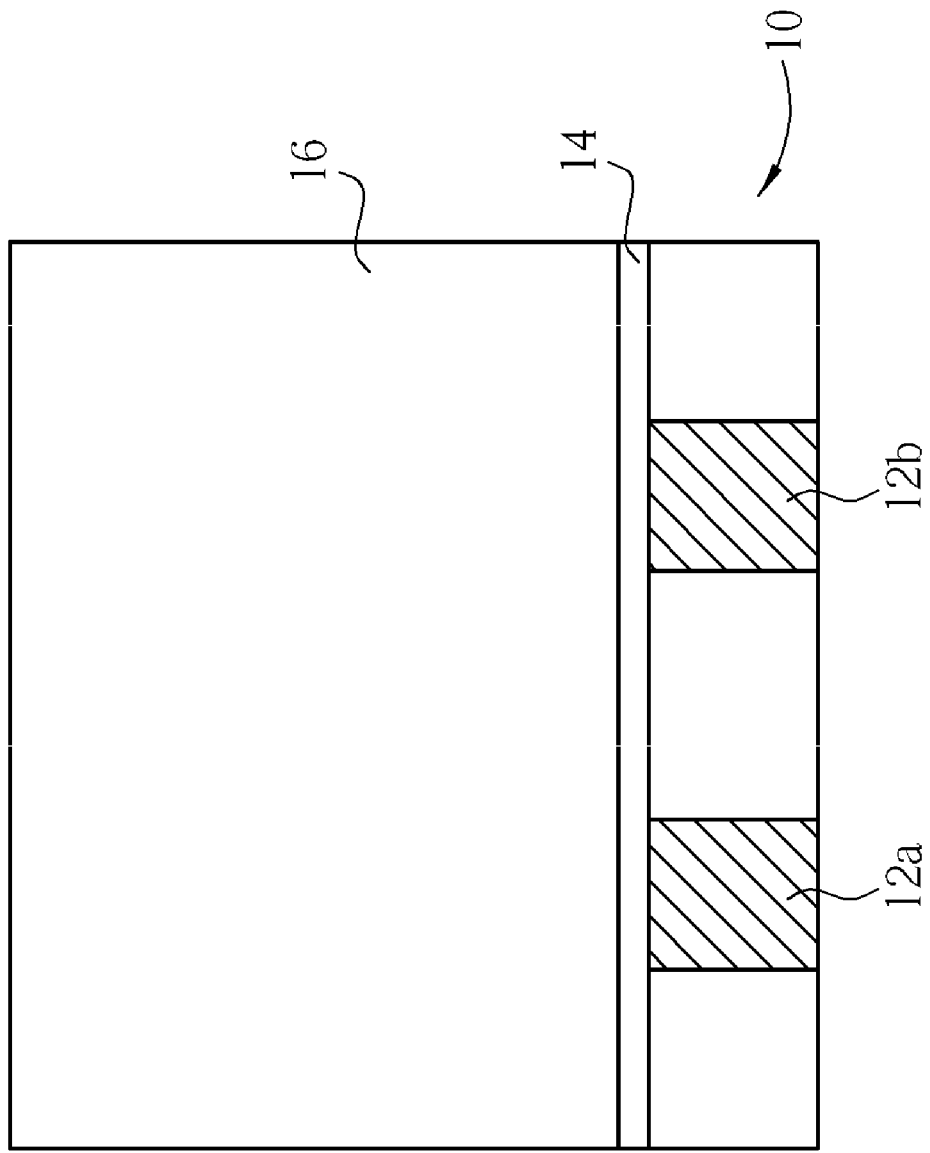
FIGS. 1-5 are schematic, cross-sectional diagrams showing a conventional method for fabricating a storage node of a crown-type stacked cell capacitor.
Figure 2:
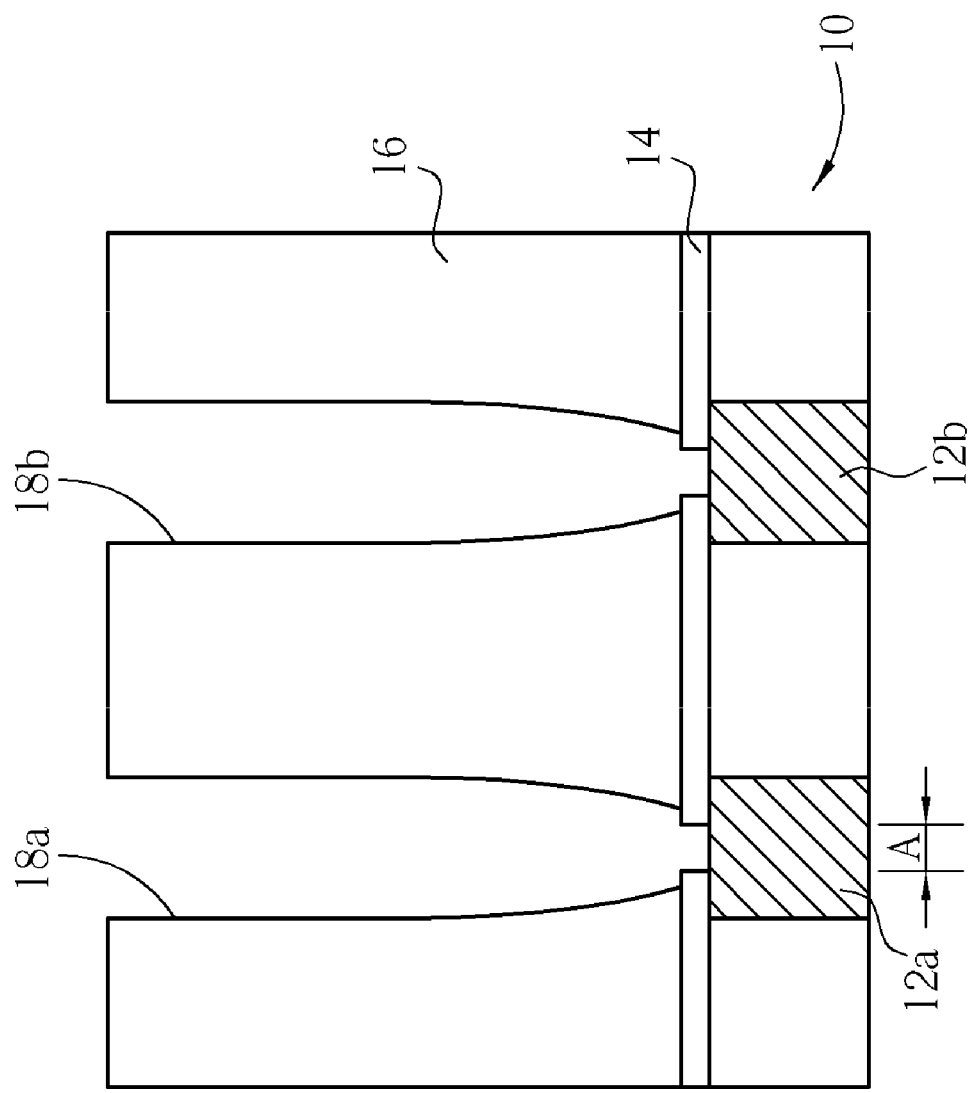
Figure 3:
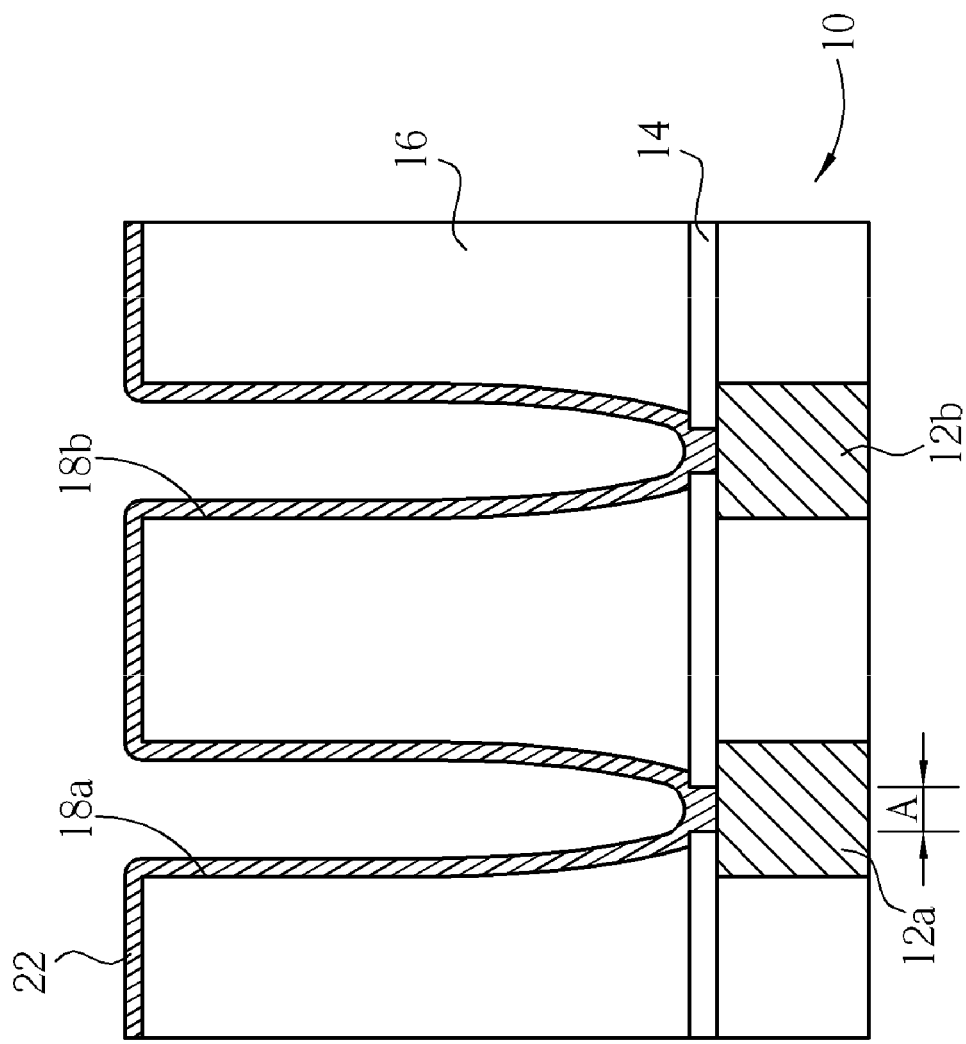
Figure 4:
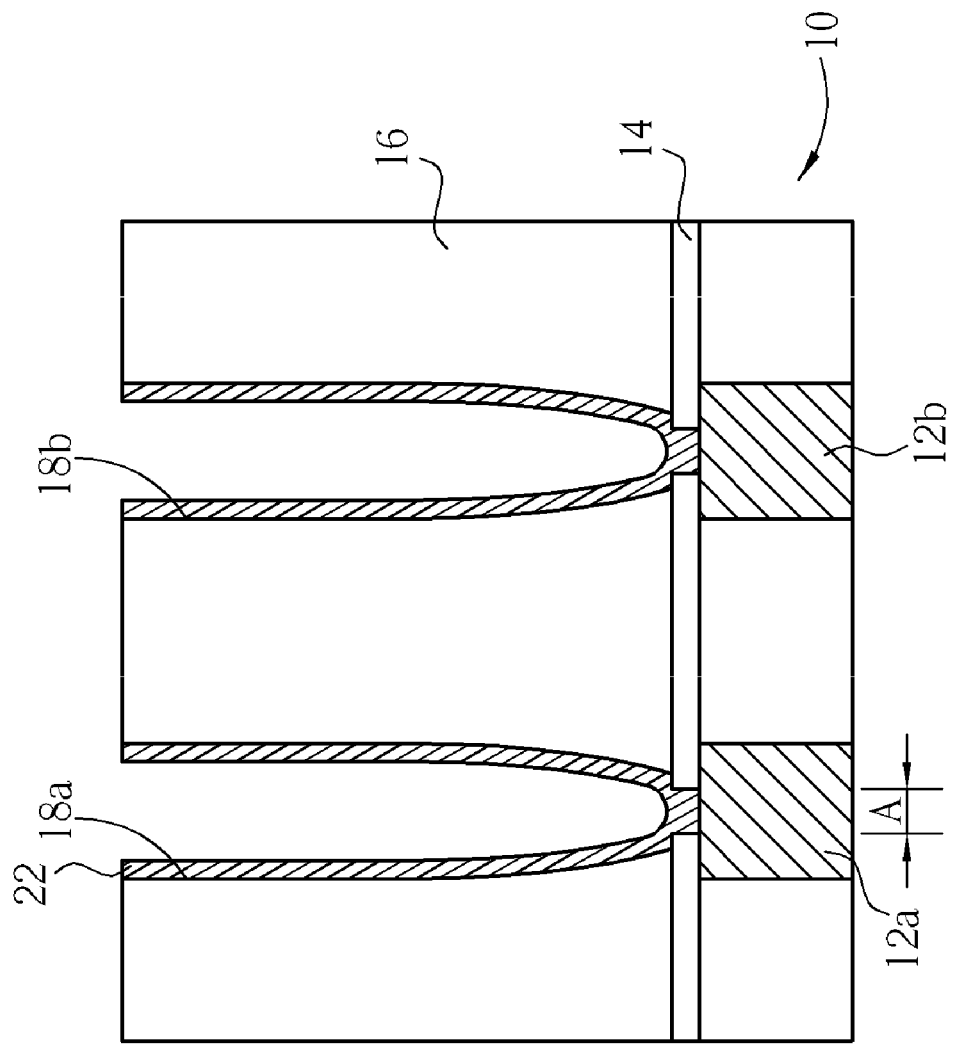
Figure 5:
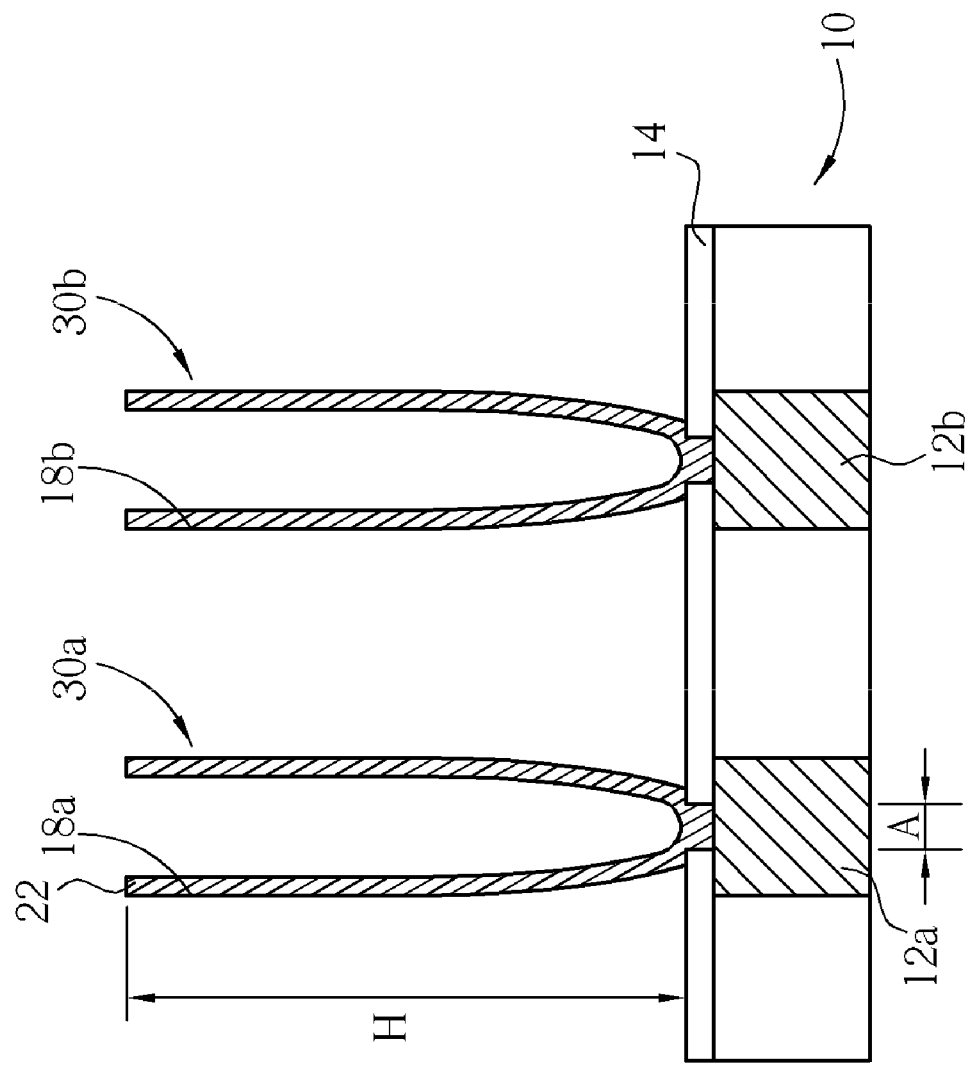
Figure 6:
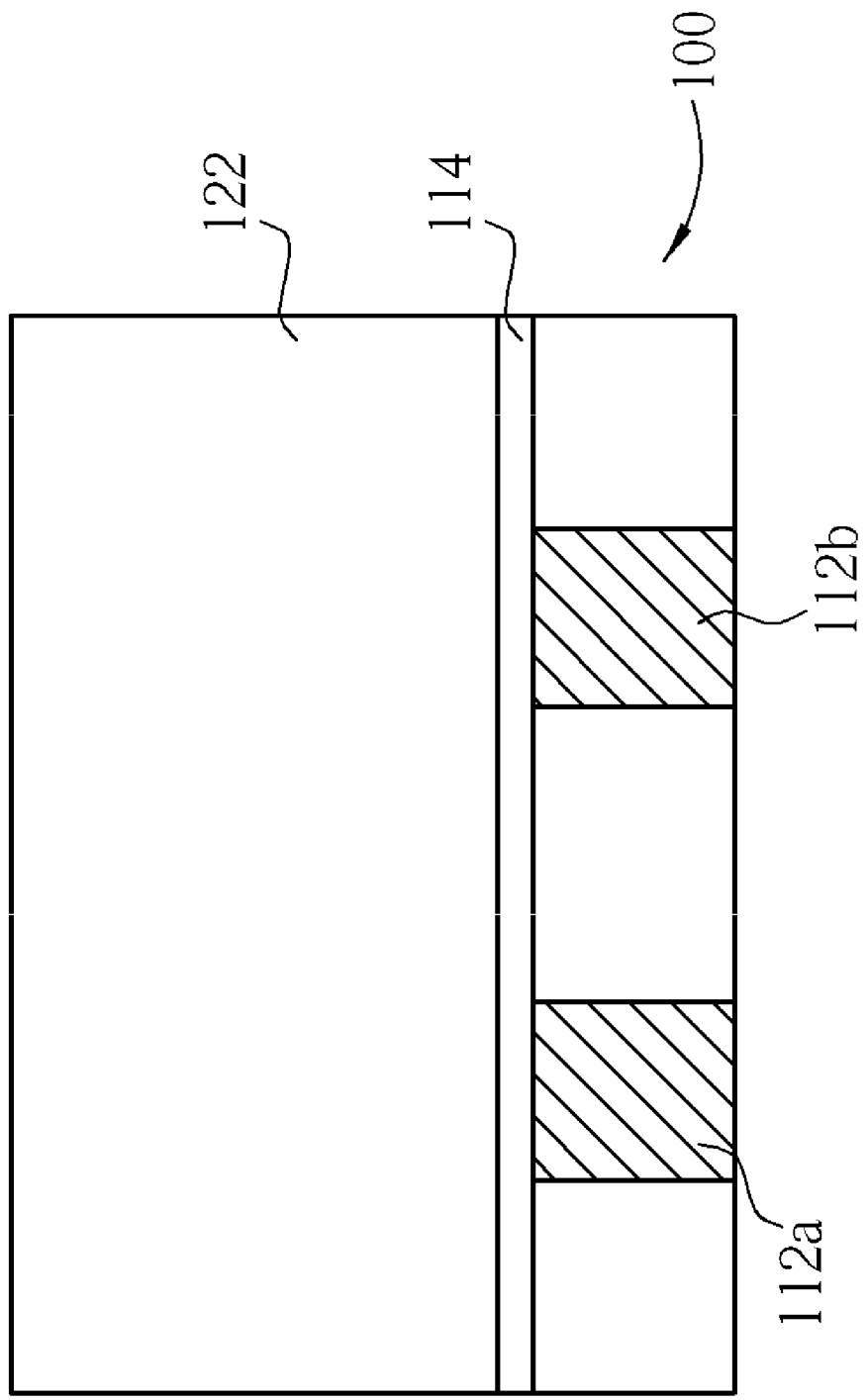
FIG. 6 to FIG. 14 are schematic, cross-sectional diagrams illustrating a method for fabricating a storage node structure of a stack capacitor in accordance with one embodiment of this invention.

Please refer to FIG. 6 to FIG. 14. FIG. 6 to FIG. 14 are schematic, cross-sectional diagrams illustrating a method for fabricating a storage node structure of a stack capacitor in accordance with one embodiment of this invention. As shown in FIG. 6, a substrate 100 such as a silicon substrate is provided. A conductive block 112a and a conductive block 112b are formed in the substrate 100. A dielectric layer 114 such as silicon nitride is deposited on the substrate 100 and covers the conductive block 112a and conductive block 112b. The dielectric layer 114 acts as an etching stop layer. A dielectric layer 122 such as USG or BSG is then formed on the dielectric layer 114. According to the embodiment of this invention, the dielectric layer 122 has a thickness of about 0.6-0.8 μm.

Figure 7:
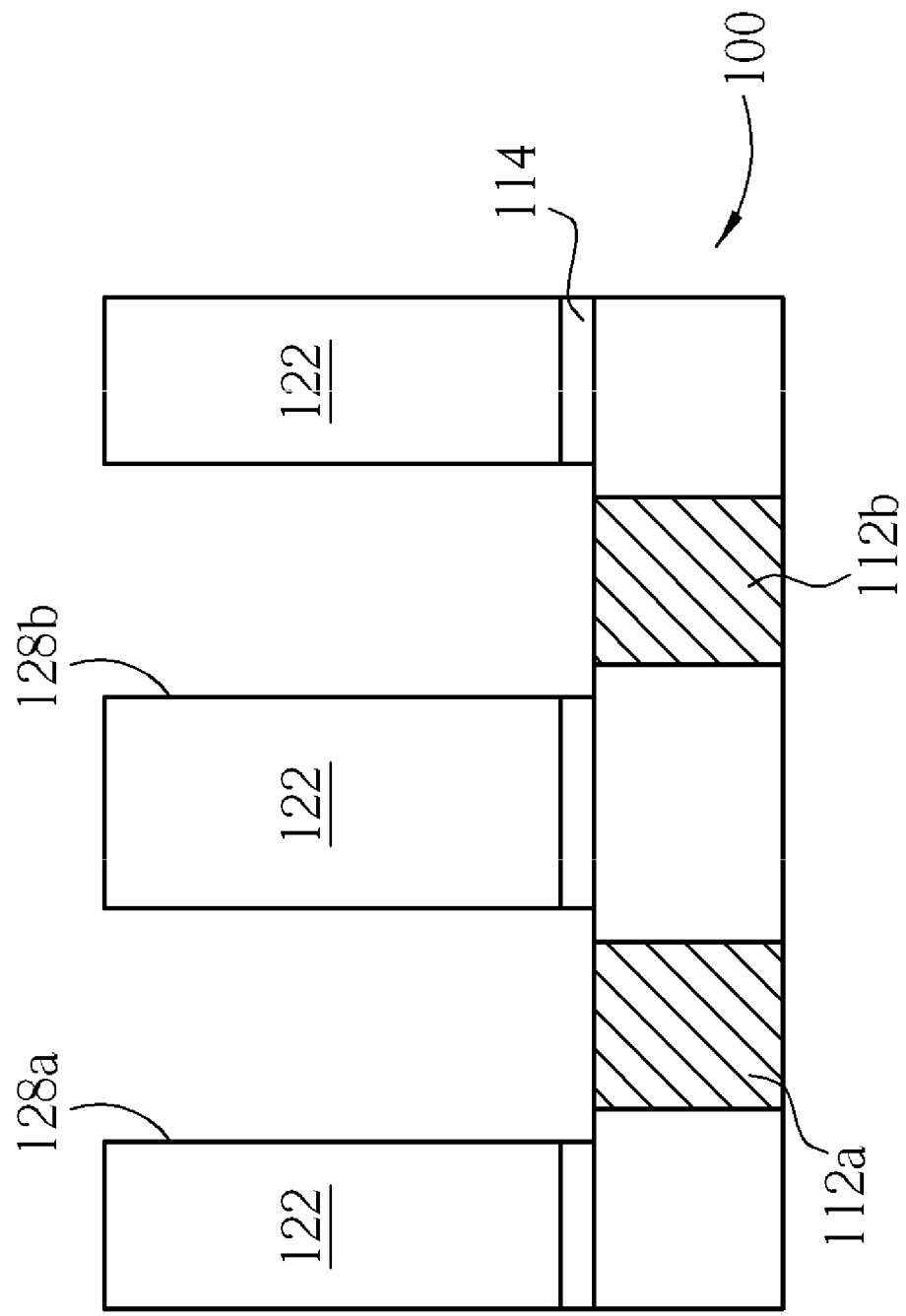

As shown in FIG. 7, a conventional lithographic process and a dry etching process are carried out to define openings 128a and 128b in the dielectric layers 122 and 114. The openings 128a and 128b expose a top surface of the conductive block 112a and a top surface of the conductive block 112b respectively. Subsequently, a cleaning process may be performed to remove the etching byproducts or particles from the surfaces of the substrate 100 and from the interior surfaces of. Since the dielectric layer 122 is not thick compared to the prior art, after etching the openings 128a and 128b, both the openings 128a and 128b have a straight vertical sidewall profile.

Figure 8:
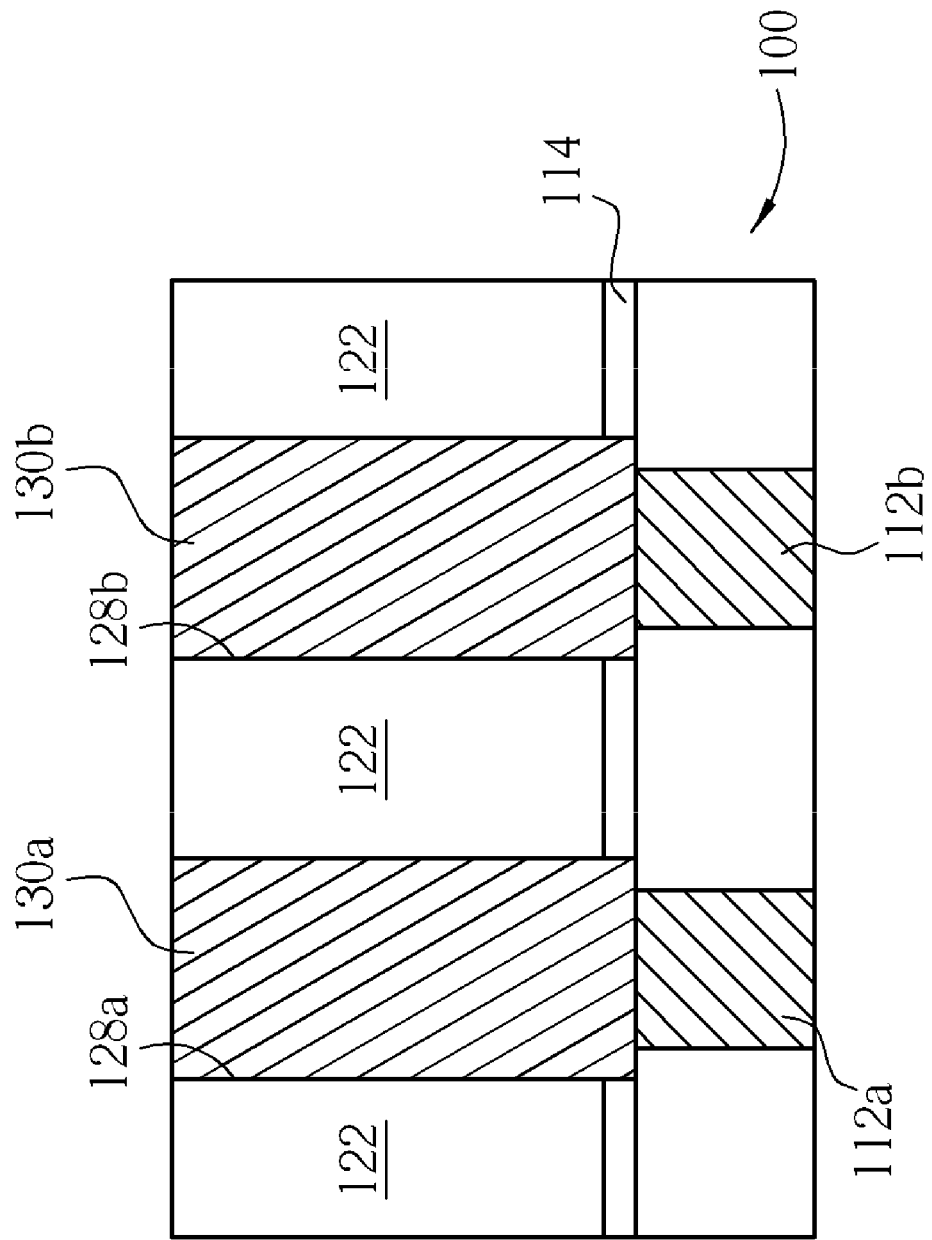

As shown in FIG. 8, a chemical vapor deposition (CVD) process and chemical mechanical polishing (CMP) are carried out to fill the openings 128a and 128b with a silicon layer 130a and a silicon layer 130b respectively. The silicon layers 130a and 130b may be doped polysilicon. The silicon layers 130a and 130b are electrically connected with the underlying conductive blocks 112a and 112b respectively.

Figure 9:
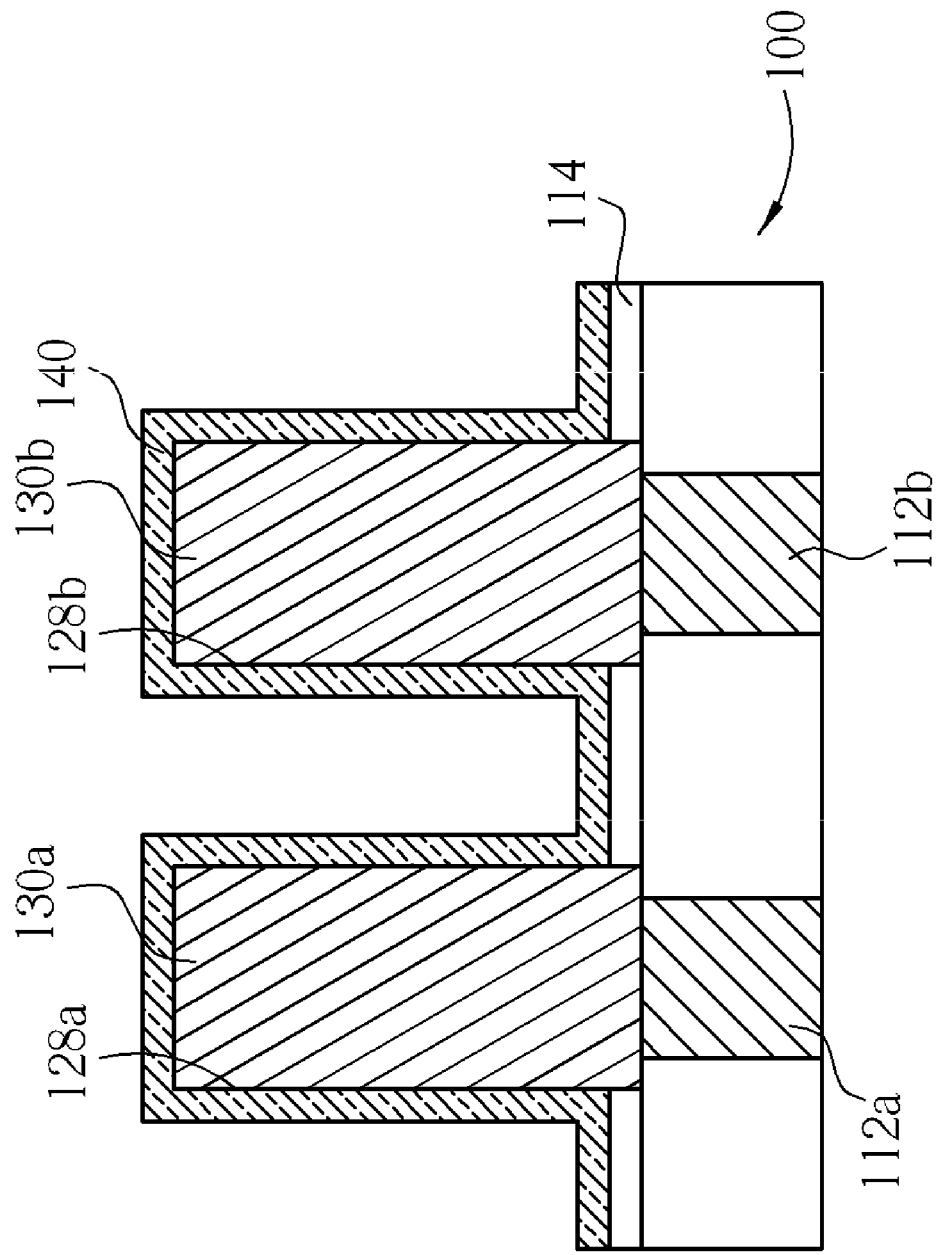

As shown in FIG. 9, after the formation of the silicon layers 130a and 130b, the dielectric layer 122 is completely removed from surface of the substrate 100, thereby exposing sidewalls of the silicon layers 130a and 130b. The dielectric layer 122 may be removed by conventional etching methods such as dry etching processes. Thereafter, a conformal conductive layer 140 such as metal is deposited on the top surfaces and the sidewalls of the silicon layers 130a and 130b and on the surface of the dielectric layer 114. According to the embodiment of this invention, the conductive layer 140 is composed of metal that has better adhesion property with silicon nitride, preferably, TiN or Ti/TiN.

Figure 10:
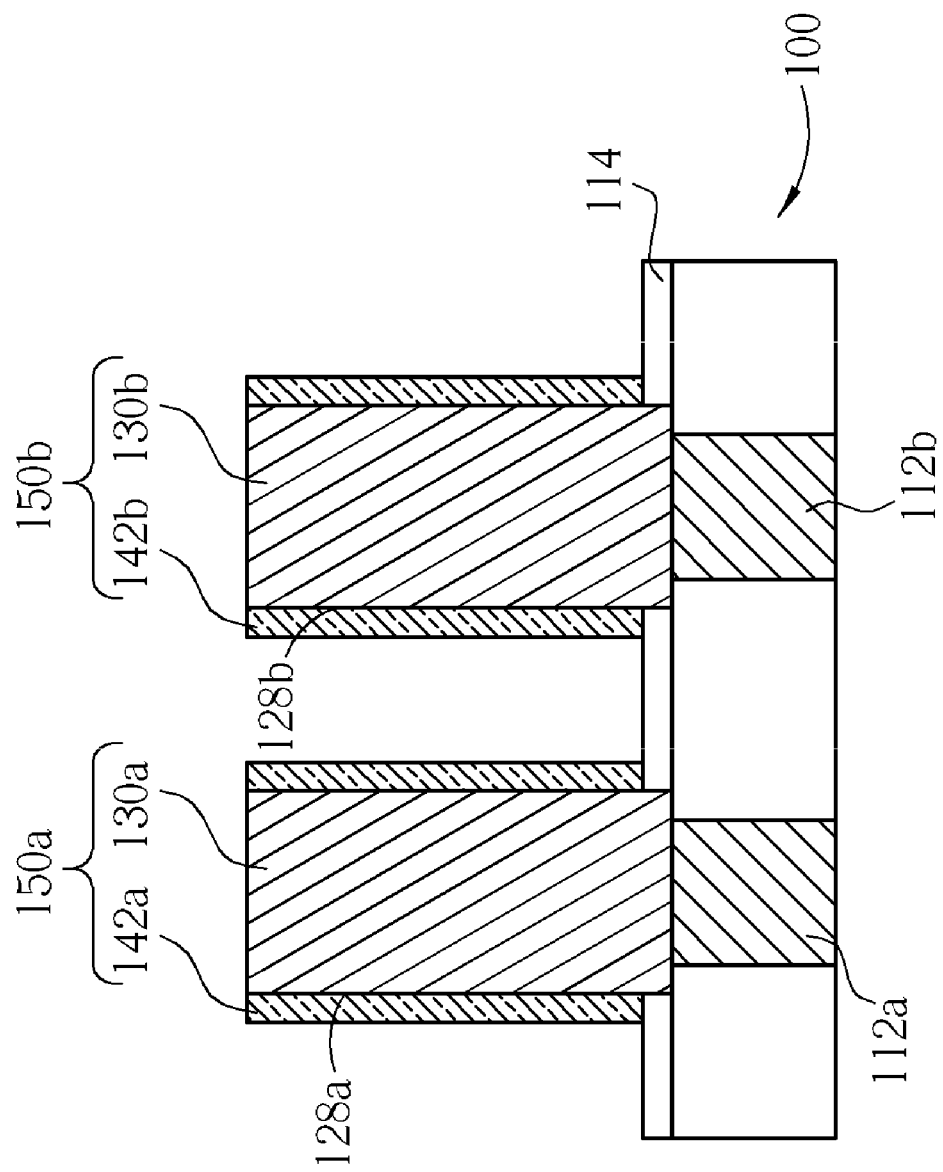

As shown in FIG. 10, a dry etching process is carried out to anisotropically etch the conductive layer 140, thereby forming annular shaped conductive spacers 142a and 142b on sidewalls of the silicon layers 130a and 130b respectively. According to the embodiment of this invention, the conductive spacers 142a and the silicon layer 130a constitute a storage node pedestal 150a, and the conductive spacers 142b and the silicon layer 130b constitute a storage node pedestal 150b. The storage node pedestals 150a and 150b have a height of about 0.6-0.8 μm.

Figure 11:
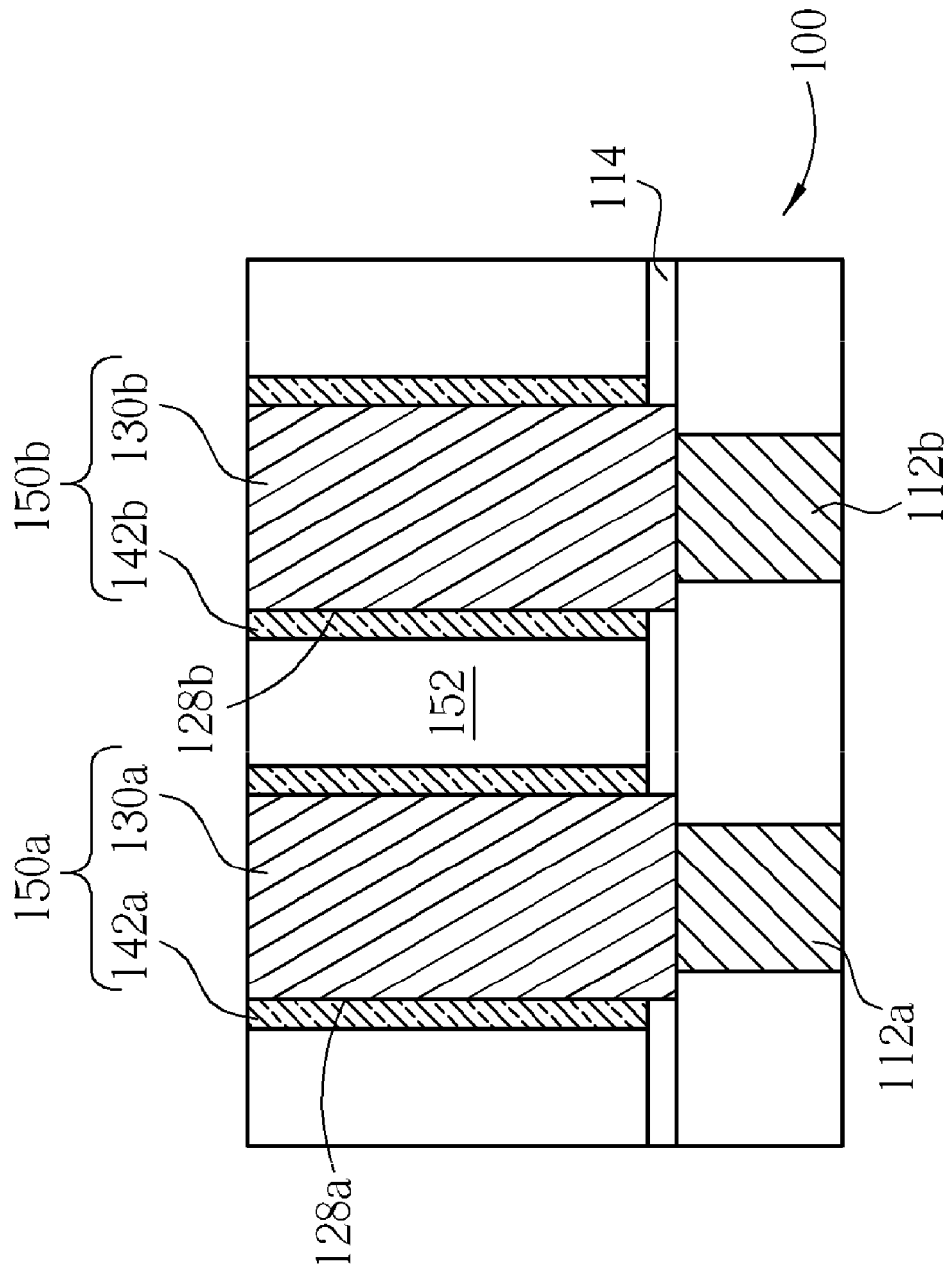

As shown in FIG. 11, a CVD process is performed to blanketly deposit a dielectric layer 152 such as USG or BSG over the substrate 100. Subsequently, a CMP process is performed to planarize the dielectric layer 152 and expose a top surface of the storage node pedestal 150a and a top surface of the storage node pedestal 150b. At this point, the remanent dielectric layer 152 fills the spacing between the storage node pedestals 150a and 150b. It is understood that the CMP process used to planarize the dielectric layer 152 may be omitted or replaced by other suitable planarization means.

Figure 12:
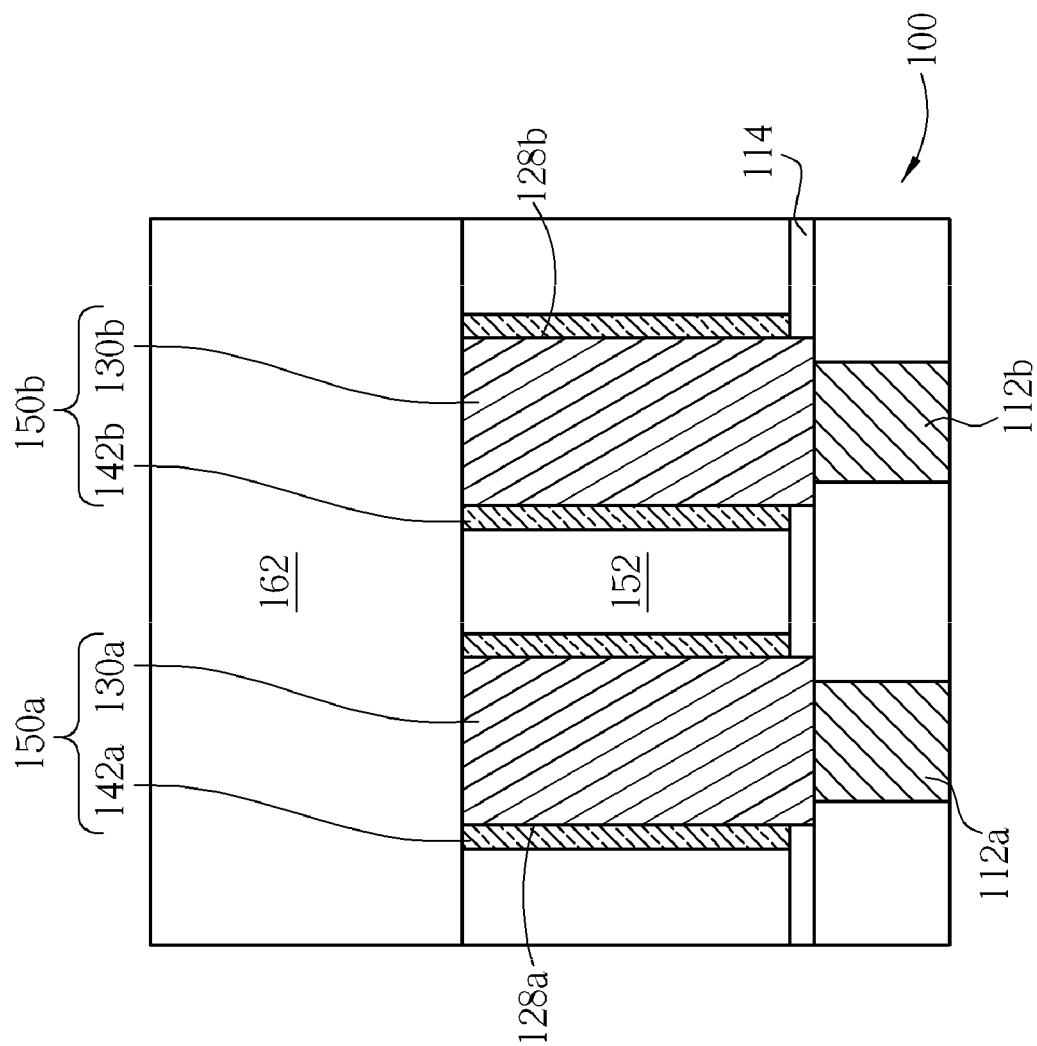

As shown in FIG. 12, a CVD process is carried out to blanket deposit a dielectric layer 162 such as USG or BSG over the substrate 100. According to the embodiment of this invention, the dielectric layer 162 has a thickness of about 0.6-0.8 μm.

Figure 13:
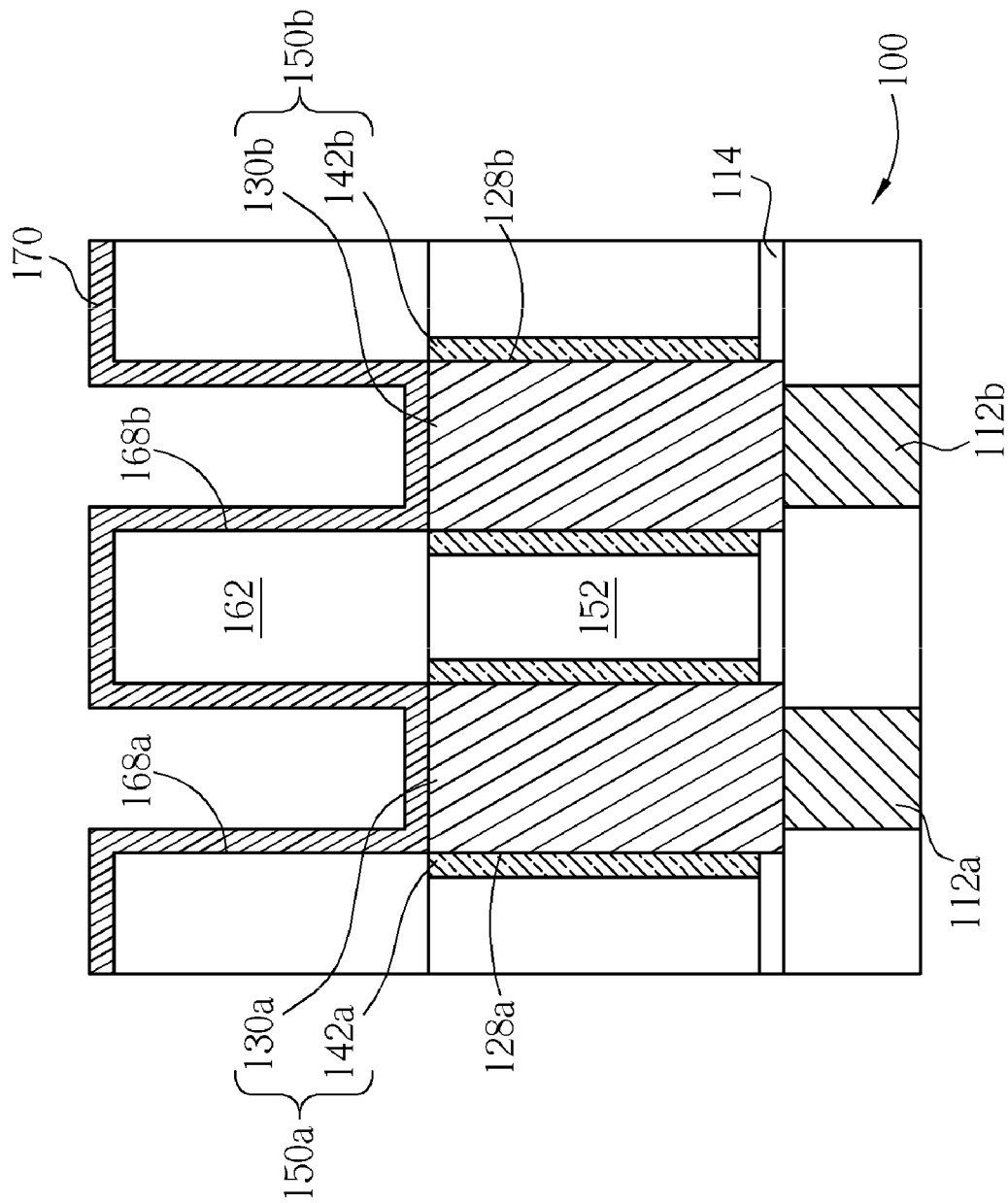

As shown in FIG. 13, a lithographic process and a dry etching process are performed to etch openings 168a and 168b into the dielectric layer 162 to expose the top surface of the storage node pedestal 150a and top surface of the storage node pedestal 150b respectively. A cleaning process may be performed to remove the etching byproducts or particles from the surfaces of the substrate 100 and from the interior surfaces of the openings 168a and 168b. Likewise, since the dielectric layer 162 is not very thick, both the openings 168a and 168b have a straight vertical sidewall profile. Subsequently, a conformal metal layer 170 such as TiN or TaN is deposited on the interior surfaces of the openings 168a and 168b and on the top surface of the dielectric layer 162.

Figure 14:
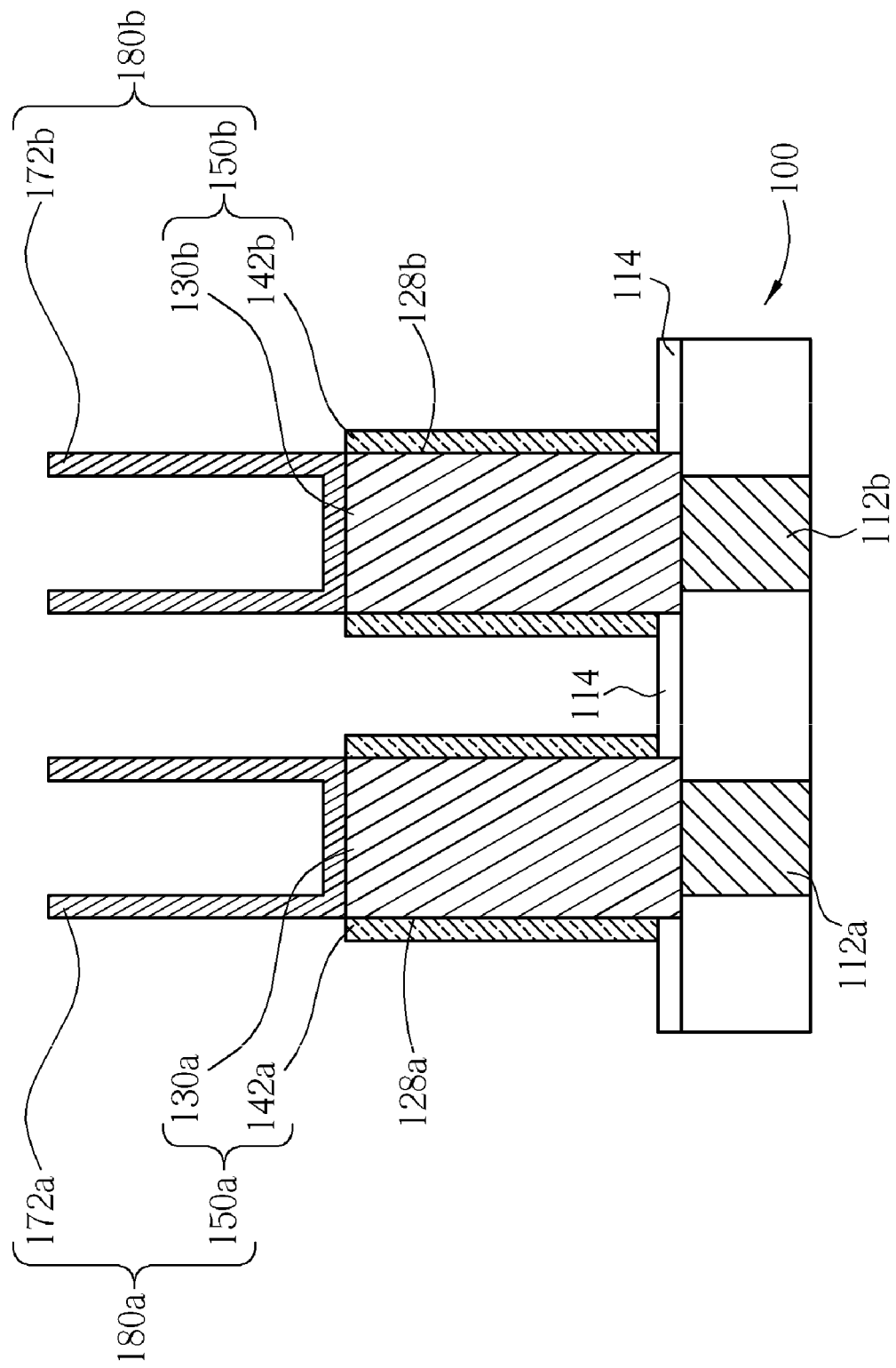

As shown in FIG. 14, a CMP process is performed to remove a portion of the metal layer 170 that is directly above the dielectric layer 162, thereby exposing the top surface of the dielectric layer 162 and forming cylindrical upper node portion 172a and cylindrical upper node portion 172b. The cylindrical upper node portion 172a and cylindrical upper node portion 172b respectively have a height of about 0.6-0.8 μm. After the CMP, an etching process such as a wet etching process is performed to completely remove the dielectric layers 162 and 152, thereby exposing the sidewalls of the storage node pedestals 150a and 150b. The cylindrical upper node portion 172a and the storage node pedestal 150a constitute a storage node structure 180a and the cylindrical upper node portion 172b and the storage node pedestal 150b constitute a storage node structure 180b.

To sum up, the present invention provides an improved storage node structure of a stack capacitor that is capable of avoiding the storage node bridge phenomenon. The storage node pedestal having a relatively larger bottom critical dimension is first formed, then the cylindrical upper node portion is stacked directly on the storage node pedestal. The cylindrical upper node portion and the storage node pedestal constitute the storage node structure.

Those skilled in the art will readily observe that numerous modifications and alterations of the device and method may be made while retaining the teachings of the invention.

What is claimed is:

1. A storage node structure, comprising:
   a substrate having thereon at least one conductive block;
   an etching stop layer formed on top of the substrate;
   a conductive layer formed on the top of the substrate wherein the conductive layer is in direct contact with the conductive block;
   a conductive spacer formed on sidewall of the conductive layer to integrally form a storage node pedestal; and
   an upper node portion stacked on and electrically connected to the storage node pedestal.

2. The storage node structure according to claim 1 wherein the conductive spacer rests on a top surface of the etching stop layer and is annularly shaped.

3. The storage node structure according to claim 1 wherein the upper node portion is a cylindrical structure.

4. The storage node structure according to claim 1 wherein the storage node pedestal has a height of about 0.6-0.8 μm.

5. The storage node structure according to claim 4 wherein the upper node portion has a height of about 0.6-0.8 μm.

6. The storage node structure according to claim 2 wherein the etching stop layer is a silicon nitride layer.

7. The storage node structure according to claim 1 wherein the conductive layer is a doped polysilicon layer.

8. The storage node structure according to claim 2 wherein the annular shaped conductive spacer is composed of metal.

9. The storage node structure according to claim 8 wherein the upper node portion is composed of metal.

* * * * *